(12) United States Patent
Scheifers et al.

(10) Patent No.: US 7,393,716 B2
(45) Date of Patent: Jul. 1, 2008

(54) ENCAPSULATED ORGANIC SEMICONDUCTOR DEVICE AND METHOD

(75) Inventors: Steven Scheifers, Hoffman Estates, IL (US); Daniel Gamota, Palatine, IL (US); Andrew Skipor, West Chicago, IL (US); Krishna Kalyanasundaram, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 346 days.

(21) Appl. No.: 11/108,025

(22) Filed: Apr. 15, 2005

(65) Prior Publication Data
US 2005/0189537 A1  Sep. 1, 2005

Related U.S. Application Data

(62) Division of application No. 10/114,488, filed on Apr. 2, 2002, now abandoned.

(51) Int. Cl.
   H01L 51/00   (2006.01)
   H01L 21/00   (2006.01)
   H01L 29/08   (2006.01)
   H01L 35/24   (2006.01)

(52) U.S. Cl. .................. 438/99; 438/115; 257/40; 257/E23.002; 257/E21.502

(58) Field of Classification Search .......... 438/99; 257/40, E21.202, E23.002
See application file for complete search history.

(56) References Cited

U.S. PATENT DOCUMENTS

| | | | |
|---|---|---|---|
| 4,925,610 A | 5/1990 | Wessling et al. | |
| 5,140,502 A | 8/1992 | Kudoh et al. | |
| 5,693,977 A | 12/1997 | Haddon et al. | |
| 6,335,267 B1 | 1/2002 | Iwamatsu et al. | |
| 6,358,664 B1 | 3/2002 | Nirmal et al. | |
| 6,365,527 B1 | 4/2002 | Yang et al. | |
| 6,388,285 B1 | 5/2002 | Black et al. | |
| 6,482,564 B2 | 11/2002 | Nirmal et al. | |
| 6,548,912 B1 | 4/2003 | Graff et al. | |
| 6,566,156 B1 | 5/2003 | Sturm et al. | |

*Primary Examiner*—David A Zameke

(57) ABSTRACT

A semiconductor device comprising organic semiconductor material (14) has one or more barrier layers (16) disposed at least partially thereabout to protect the organic semiconductor material (14) from environment-driven changes that typically lead to inoperability of a corresponding device. If desired, the barrier layer can be comprised of partially permeable material that allows some substances therethrough to thereby effect disabling of the encapsulated organic semiconductor device after a substantially predetermined period of time. Getterers (141) may also be used to protect, at least for a period of time, such organic semiconductor material.

19 Claims, 2 Drawing Sheets

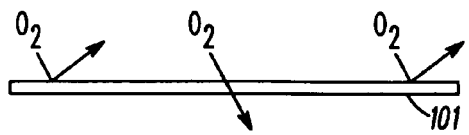
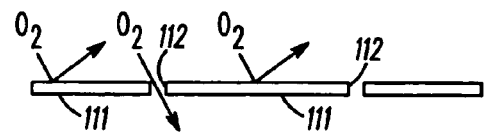
FIG. 10    FIG. 11
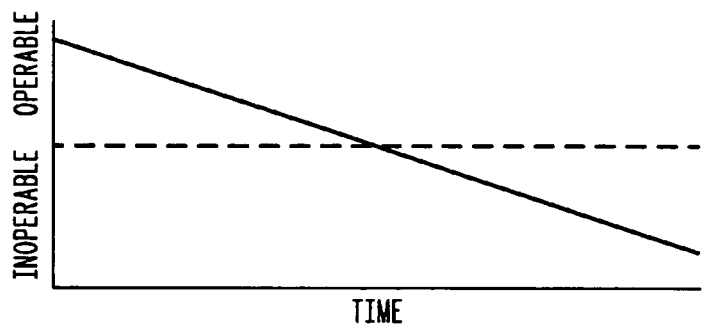
FIG. 12
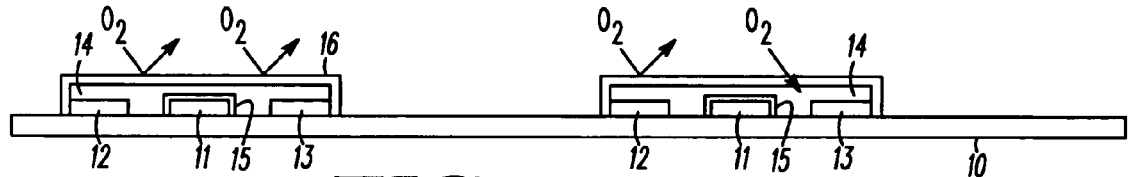
FIG. 13
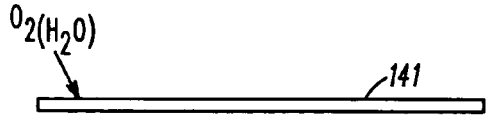
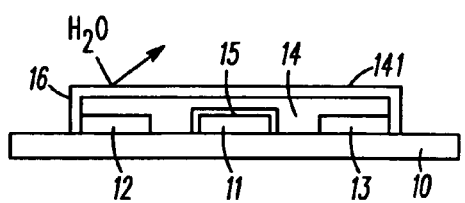
FIG. 14    FIG. 15
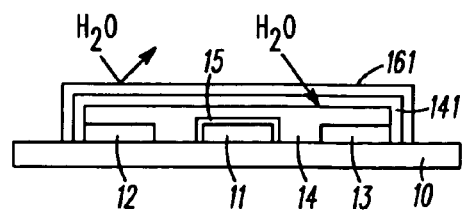
FIG. 16

ENCAPSULATED ORGANIC SEMICONDUCTOR DEVICE AND METHOD

CROSS REFERENCE TO RELATED APPLICATION

This is a division of prior application Ser. No. 10/114,488, filed Apr. 2, 2002 now abandoned, which is hereby incorporated herein by reference in its entirety.

TECHNICAL FIELD

This invention relates generally to semiconductors and more particularly to organic semiconductor materials.

BACKGROUND

Components and circuits comprised of semiconductor materials are known in the art. Such technology has been highly successful. For some applications, however, traditional semiconductor processing over-performs and represents unneeded form factors and capabilities at a commensurate additional cost. Traditional semiconductor processing also usually requires batch processing to achieve a reasonable cost per part because the fabrication facilities and equipment required are extremely expensive. Also, many semiconductor devices require a lengthy fabrication time and often require numerous chemicals, some of which are highly toxic and require special handling. These aspects of traditional semiconductor fabrication do not well support low data storage and data transmission rate applications and/or other less expensive needs.

Organic semiconductors have been proposed as an alternative to standard semiconductor paradigms. Organic semiconductors hold the potential for serial or continuous processing and/or otherwise relatively low cost manufacturing requirements. Unfortunately, to date, while working organic semiconductor devices have been demonstrated, the operating life of such devices tends towards extreme brevity. In some instances, failure occurs within an hour or two of fabrication. This results in many cases through interaction of the organic semiconductor material with active contaminants in the environment, including, for example, oxygen and water ($H_2O$ in both condensed and vaporous form). Such interaction eventually renders the organic material more conductive than semiconductive and this usually leads to device failure.

Present industry efforts emphasize searching for an organic semiconductor material that will withstand such environmental conditions. These efforts do not guarantee success, however, and, at a minimum, represent considerable expense and delay of commercialization of the technology.

BRIEF DESCRIPTION OF THE DRAWINGS

The above needs are at least partially met through provision of the encapsulated organic semiconductor device and method described in the following detailed description, particularly when studied in conjunction with the drawings, wherein:

FIG. 10 illustrates another barrier embodiment configured in accordance with the invention;

FIG. 11 illustrates yet another barrier embodiment configured in accordance with the invention;

FIG. 12 illustrates a graph that depicts a movement from a state of operability to a state of inoperability over time in accordance with an embodiment of the invention;

FIG. 13 illustrates yet another multi-device embodiment configured in accordance with the invention;

FIG. 14 illustrates a getterer layer embodiment configured in accordance with the invention;

FIG. 15 illustrates a getterer layer embodiment configured in accordance with the invention; and FIG. 16 illustrates yet another getterer layer embodiment configured in accordance with the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

Generally speaking, pursuant to these various embodiments, an organic semiconductor device or array of devices is at least partially encapsulated by one or more barrier layers of material that are substantially impermeable to one or more environmental substances that would otherwise tend to effect significant electrical performance degradation of the organic semiconductor material itself. In one embodiment, one or more of the layers can be purposefully partially permeable to allow for eventual failure of the corresponding device after a substantially predetermined period of time. In one embodiment, getterer material is used to protect, at least for a time, organic semiconductor material from the substance(s) being absorbed by the getterer.

Figure 1:
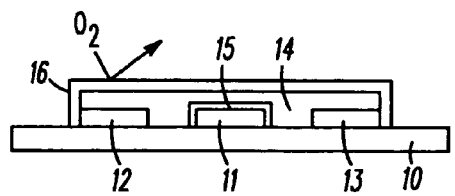
FIG. 1 illustrates a first embodiment configured in accordance with the invention.

Referring now to FIG. 1, a first embodiment will be described. An initial substrate 10 can be comprised of a variety of materials, including flexible and substantially rigid materials. In general, the substrate 10 itself should be an insulator. Various plastics, including thin flexible sheets such as polyester, generally work well for these purposes. Depending upon the application, however, other materials can work as well, including treated cloth and paper. The substrate 10 can be of various sizes as commensurate with the desired size of the final result.

An organic semiconductor device (or devices) is formed on the substrate 10. For purposes of this description, the device is a MOSFET (metal oxide semiconductor field effect transistor) comprised of a gate electrode 11 having a dielectric layer 15 disposed thereover and a source electrode 12 and drain electrode 13 formed on the substrate 10. These electrodes are formed of a conductive material with the gate, source and drain electrodes 11, 12 and 13 being formed of a material, such as copper, gold, silver, nickel, platinum, conductive polymer thick film, conductive polymer, carbon-based material, or tungsten as will result in an ohmic contact as between itself and an organic semiconductor material. An organic semiconductor material 14 overlies at least portions of the source electrode 12 and drain electrode 13. (Conductive paths to each electrode 11, 12, and 13 will ordinarily be provided to facilitate desired functionality though for purposes of clarity, such paths are not depicted in these figures.)

Any of the above elements (the electrodes 11, 12, and 13, the dielectric 15, and the organic semiconductor material 14) can be formed by use of one or more printing processes. For example, contact printing processes (including but not limited to stamping, screen printing, flexographic, and micro-contact printing) and non-contact printing processes (including but not limited to ink jet, electrostatic, laser transfer, and micro-dispensing) can be used to print the indicated materials as described. Depending upon the material form and carrier used, air drying and/or curing steps may be appropriate to ensure the desired adhesion, electrical performance, and mechanical integrity.

A typical device will have an overall thickness of only a few microns (depending upon the specific materials, deposition process, and number of layers) and can have a footprint ranging from a few microns to one thousand or more microns. Notwithstanding such sizes, when formed upon a flexible substrate, the result device can maintain normal functionality even when flexed during use (of course, extreme bending of the substrate may, at some point, disrupt the continuity of one of more of the constituent elements of the device).

Figure 2:
FIG. 2 illustrates a detailed depiction of an oxygen barrier embodiment configured in accordance with the invention.
Figure 3:
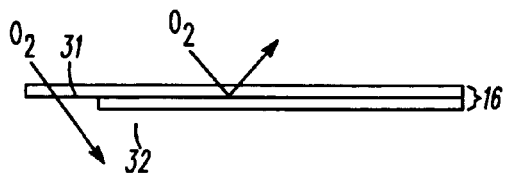
FIG. 3 illustrates a detailed depiction of another oxygen barrier embodiment configured in accordance with the invention.
Figure 4:
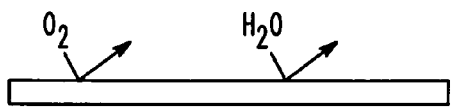
FIG. 4 illustrates a detailed depiction of a multi-substance barrier embodiment configured in accordance with the invention.
Figure 5:
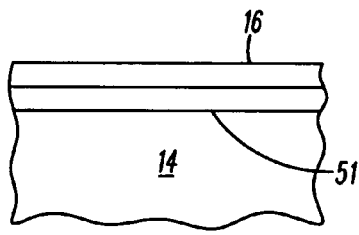
FIG. 5 illustrates a detailed depiction of an adhesion layer used in conjunction with a barrier embodiment configured in accordance with the invention.

In this embodiment, an oxygen barrier 16 is disposed over the organic semiconductor material 14 to thereby protect the organic semiconductor material 14, at least for a time, from significant electrical performance degradation due to oxygen 17 in the local environment. As shown, the barrier 16 completely covers the organic semiconductor material 14. If desired, however, only part of the organic semiconductor material 14 could be covered though less protection will likely result. With reference to FIG. 2, the barrier 16 may be any material that is substantially impermeable to oxygen. In one embodiment, silica is disposed to thereby comprise the barrier layer 16. For example, methods as known in the art such as vacuum deposition, solution processing, and so forth could be used to deposit the silica or other barrier material. With reference to FIG. 3, in another embodiment, the barrier 16 can be a free standing film comprised of an oxygen permeable carrier 31 and an oxygen barrier material 32, such as silica, that is disposed on the carrier 31. For example, mylar with an aluminum coating could be used in this regard. Such a carrier 31 can be flexible if desired and applied to the organic semiconductor material 14 using lamination or other application technique as appropriate to the application. Of course, and referring now to FIG. 4, it is also possible for the oxygen barrier 16 to also serve as a barrier to other potentially damaging substances. For example, as depicted, the barrier 16 can substantially repel both oxygen and $H_2O$ (in vapor and/or condensed form). Some suitable materials may be applied directed to the organic semiconductor material 14 and will adhere satisfactorily thereto (either with or without subsequent treatment and/or curing as appropriate to the material used). In other instances it may be appropriate to apply the barrier layer 16 to the organic semiconductor material 14 using an intervening adhesive material 51 as shown in FIG. 5.

Figure 6:
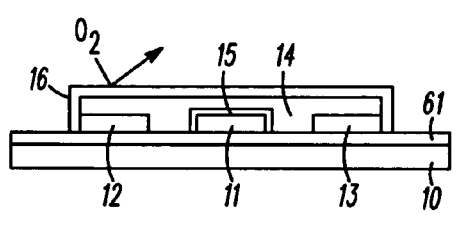
FIG. 6 illustrates yet another depiction of an embodiment configured in accordance with the invention.

In each of the above described embodiments, oxygen in the local environment is substantially prevented from reaching the organic semiconductor material 14 through use of a barrier layer 16 disposed over the organic semiconductor material 14. In embodiments where the substrate 10 layer itself comprises an oxygen impermeable material, such a configuration should contribute to significantly improved operative life of the corresponding organic semiconductor active device (s). When the substrate 10 is not itself impermeable to oxygen, however, then as depicted in FIG. 6 an additional barrier layer 61 as applied to the substrate 10 will serve to protect the organic semiconductor material 14 from harm due to oxygen passing through the substrate 10. As depicted, this additional barrier layer 61 is disposed on a side of the substrate 10 that is common to the organic semiconductor device itself. In an appropriate configuration, however, it may also be possible and or suitable to dispose the additional barrier layer on the opposing side of the substrate 10 or to dispose the additional barrier layer on both sides of the substrate 10.

Figure 7:
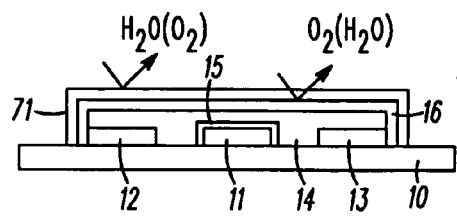
FIG. 7 illustrates a multi-layer barrier embodiment configured in accordance with the invention.

As noted above, oxygen is not the only environmental substance that can contribute to a greatly reduced operating life for an organic semiconductor device. $H_2O$ (in vapor and/or condensed form) is another common substance that can detrimentally impact operating life expectances. When the oxygen barrier 16 constitutes a barrier to $H_2O$ (in vapor and/or condensed form) as described above with respect to FIG. 4, then the barrier 16 will serve to also protect the organic semiconductor material 14 from this substance. When the oxygen barrier 16 does not also constitute an $H_2O$ barrier, however, then if desired, an additional $H_2O$ barrier layer 71 can be applied as depicted in FIG. 7 to additionally protect the organic semiconductor material 14 from $H_2O$ (in vapor and/or condensed form). As shown, the $H_2O$ barrier 71 can overly the oxygen barrier 16. If desired, of course, this layering order can be reversed. It should also be noted that substances such as condensed $H_2O$ themselves constitute a good solvent and hence often contain yet additional contaminants such as, for example, carbonic acid or free ions. Such contaminants can degrade performance of organic semiconductor materials and hence in many instances it will be appropriate or necessary for the $H_2O$ barrier to also be relatively impermeable to such substances that are dissolved in the $H_2O$ and/or for an additional barrier layer to be used that is impermeable to such substances.

Oxygen and $H_2O$ (in vapor and/or condensed form) barriers have been used above to illustrate the described embodiments. Other barriers are of course available and can be used in substitution for or in combination with the barriers described to protect the organic semiconductor material 14 against a variety of performance-degrading environmental agents as appropriate to a given set of operating circumstances.

Figure 8:
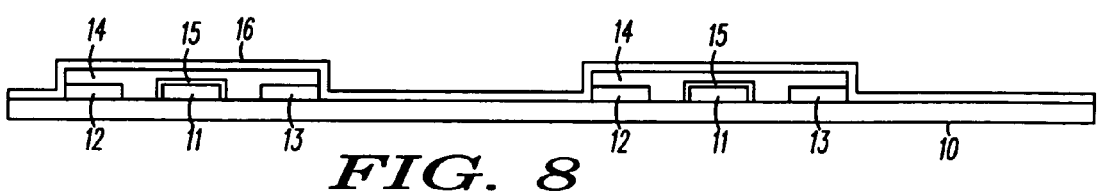
FIG. 8 illustrates a multi-device embodiment configured in accordance with the invention.
Figure 9:
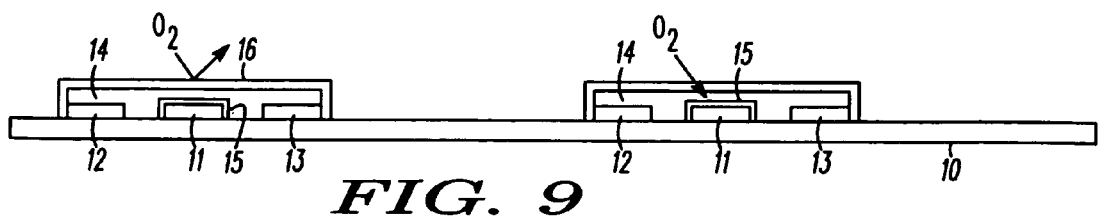
FIG. 9 illustrates another multi-device embodiment configured in accordance with the invention.

A plurality of organic semiconductor devices can be formed on a single substrate. If desired, and as depicted in FIG. 8, each such organic semiconductor device sharing a substrate can be protected by a common barrier layer 16. Such an embodiment can be used regardless of whether the devices themselves are interconnected or constitute discrete circuits or components. Or, if desired, some such devices can be protected by a barrier layer 16 and others can be left unprotected as illustrated in FIG. 9.

As noted earlier, the purpose of the barrier layer (or layers) is to protect the organic semiconductor material from significantly changing in response to environmental constituents. This tendency of organic semiconductor devices to fail after sufficient exposure to such influences, however, may under some circumstances be an exploitable tendency. For example, it may be desirable to limit the useful life of a given circuit or component to a particular time frame (one very simple example would be to use a time-limited circuit to indicate, by its operable status, passage of a predetermined period of time). With such designs in mind, a barrier layer 101 can be comprised, for example, of material that, while somewhat resistant to the passage of oxygen (or other substance of concern or interest) is nevertheless somewhat permeable to oxygen as illustrated in FIG. 10. As another approach, and as illustrated in FIG. 11, a material 111 that is otherwise substantially impermeable to oxygen (or other substance of concern or interest) can be deposited with small openings 112 disposed therethrough to allow a desired amount of oxygen to pass therethrough (such small openings 112 can be the result of the deposition process itself and/or can be subsequently formed through use of, for example, lasers, mechanical drills, and so forth). By using such a barrier layer, a sufficient amount of oxygen (or other substance of concern or interest) will eventually pass through the barrier layer and cause a corresponding failure of the encapsulated device as generally illustrated in FIG. 12. For example, a particular circuit could be fashioned that, after approximately 90 days, would likely fail due to impairment of the circuit's organic semiconductor material due to this cause. Such circuits, having a substantially controllable lifespan, could be used for a variety of purposes. The relatively low cost of such a circuit makes more reasonable the notion of fielding an intentionally fixed-duration circuit.

As described, the entire device is encapsulated within a partially permeable barrier layer. If desired, when a plurality of devices are present on a single substrate 10 as shown in FIG. 13, some of the devices can be encapsulated within a fully impermeable barrier layer 16 as described earlier while at least one of the remaining devices is encapsulated instead by a partially permeable barrier layer 131. Again, the purpose of such a configuration would be to provide a limited life circuit or circuit element that would likely fail after a reasonably predictable period of time. This failure mode could be detected by the remaining operable circuitry to effect a variety of responses as appropriate to a given application.

The embodiments discussed above provide an impermeable, or partially permeable, barrier to one or more environmental components. Another kind of substance is known as a getterer. As illustrated in FIG. 14, a getterer 141 will absorb rather than bar or pass a corresponding substance. Various getterers are known in the art and include $H_2O$ getterers (desiccants of various kinds) and oxygen getterers (so-called oxygen scavengers such as oxygen scavenging polyamides). Such a getterer 141 can be used as a layer around an organic semiconductor device as depicted in FIG. 15. So configured, the getterer 141 will absorb the corresponding environmental substance and protect the organic semiconductor material 14 until the getterer 141 becomes saturated. Once saturated, the getterer 141 will typically begin to release the previously absorbed substance. When this occurs the organic semiconductor material 14 will then react accordingly and the corresponding device will likely fail. So, again, a limited-life device can be enabled with the life expectancy being determined at least in part by the amount of absorbent material provided. If desired, and as illustrated in FIG. 16, a barrier layer 161 can be disposed over the exterior of the getterer 141 to provide additional protection. If the barrier layer 161 is of the type that allows some egress to the controlled substance, as depicted, then this attribute again becomes a parameter that can be utilized to achieve a device having a particular likely operative lifespan.

The various embodiments described above provide different ways to fully or partially protect an organic semiconductor device (or devices) from a variety of substances. Some organic semiconductor materials, however, may be sensitive to one or more bandwidths of light energy (including, in particular, violet and ultraviolet bands). Such materials may degrade when exposed to the corresponding light and such degradation may again lead to electronic failure of the device. The substance barrier or barriers (or getterers) described above may therefore also be fully or partially opaque to specific wavelengths of light energy to avoid or control performance degradation due to this contributing factor. Such light barriers can either be single-function in this regard or the desired opacity can be achieved with a dual-purpose barrier that also serves, for example, to block oxygen. A partially opaque light barrier may be used when seeking to provide a limited life device wherein the approximate lifespan of the device is at least partially controllable by appropriate selection of the barrier opacity.

The various embodiments described above provide different ways to fully or partially protect an organic semiconductor device (or devices) over a substantially determinable period of time (widely varying substance concentrations in the ambient environment will of course likely tend to lead to variability in the lifetime estimation as well). Fully or partially impermeable materials and/or getterers can be utilized to effect these embodiments. The various embodiments set forth are relatively inexpensive and do not add undue expense to detract from the already relatively low costs of working with organic semiconductor materials. These techniques are also workable with a variety of substrate materials. Furthermore, these embodiments are ready for immediate deployment and need not await future significant developments with respect to organic semiconductor materials themselves.

The embodiments described above present the various elements as being stacked in a particular order. Other orientations, however, are possible and acceptable (especially with respect to the device elements themselves). Furthermore, and as stated earlier, the MOSFET device has been used as an illustrative mechanism only. These embodiments are usable with virtually all other organic semiconductor device configurations as well.

A wide variety of materials can be used consistently with the above processes and embodiments. Furthermore, a wide range of processing parameters can be varied, including device size and constituent element sizes, to suit a wide variety of application requirements. Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:
1. A method comprising:
providing at least one organic semiconductor device having at least some organic semiconductor material wherein the organic semiconductor device exhibits significant electrical performance degradation when the organic semiconductor material is exposed to at least a first given condition;
disposing a barrier between the organic semiconductor material and local environment to protect the organic semiconductor material from the given condition in the local environment, wherein disposing a barrier further comprises disposing a barrier between the organic semiconductor material and the local environment such that the organic semiconductor device is substantially protected for only a temporary predetermined maximum period of time from electrical performance degradation due to the first given condition in the local environment.

2. The method of claim 1 wherein the first given condition comprises at least a presence of at least a first given substance.

3. The method of claim 2 wherein the first given substance comprises oxygen and wherein the barrier comprises an oxygen barrier.

4. The method of claim 1 wherein the first given substance comprises $H_2O$ wherein the barrier comprises an $H_2O$ barrier.

5. The method of claim 4 wherein the $H_2O$ comprises both condensed and gaseous phase $H_2O$.

6. The method of claim 2 wherein the first given substance comprises at least oxygen and $H_2O$ and wherein the barrier comprises an oxygen barrier and an $H_2O$ barrier.

7. The method of claim 1 wherein the first given condition comprises a presence of at least one given wavelength of light energy and wherein the barrier comprises a barrier that is at least substantially opaque with respect to the at least one given wavelength of light energy.

8. The method of claim 1 wherein the barrier is at least partially comprised of silica.

9. The method of claim 1 wherein the barrier has small openings intentionally disposed therethrough, which openings are permeable to the first given condition.

10. The method of claim 1 wherein the predetermined maximum period of time is less than 90 days.

11. An organic semiconductor device comprising:
   organic semiconductor material that degrades with respect to at least one operating characteristic when unduly exposed to at least a first given condition;
   a partial barrier disposed over at least a portion of the organic semiconductor material to thereby partially, but not fully, protect the portion from an ambient presence of the first given condition, such that the organic semiconductor material will sufficiently degrade with respect to performance through exposure to the first given condition over time so as to render the organic semiconductor device substantially inoperative within a predetermined maximum period of time.

12. The organic semiconductor device of claim 11 wherein the first given condition comprises a presence of oxygen.

13. The organic semiconductor device of claim 11 wherein the first given condition comprises a presence of $H_2O$.

14. The organic semiconductor device of claim 11 wherein the partial barrier has small openings disposed therethrough to permit the exposure to the first given condition.

15. The organic semiconductor device of claim 11 wherein the first given condition comprises a presence of at least one given wavelength of light energy and wherein the partial barrier comprises a barrier that is at least partially opaque over time with respect to the at least one given wavelength of light energy.

16. The organic semiconductor device of claim 11 wherein the predetermined maximum period of time is less than 90 days.

17. An organic semiconductor device comprising:
   organic semiconductor material that degrades with respect to at least one operating characteristic when unduly exposed to at least a first given condition;
   barrier means disposed between the organic semiconductor material and a local environment for protecting the organic semiconductor material from the first given condition in the local environment for only a temporary predetermined maximum period of time.

18. The organic semiconductor device of claim 17 wherein the temporary predetermined maximum period of time is less than about 90 days.

19. The organic semiconductor device of claim 17 wherein the first given condition comprises at least one of:
   a presence of oxygen;
   a presence of condensed $H_2O$;
   a presence of gaseous phase $H_2O$;
   a presence of at least one given wavelength of light energy.

* * * * *